(12) United States Patent
Okuyama et al.

(10) Patent No.: US 10,683,432 B2
(45) Date of Patent: Jun. 16, 2020

(54) COATING COMPOSITION

(71) Applicant: TOYO SEIKAN GROUP HOLDINGS, LTD., Tokyo (JP)

(72) Inventors: Shinpei Okuyama, Yokohama (JP); Shunya Nangou, Yokohama (JP); Kota Mori, Yokohama (JP); Naru Kawahara, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 0 days.

(21) Appl. No.: 16/153,580

(22) Filed: Oct. 5, 2018

(65) Prior Publication Data

US 2019/0040275 A1 Feb. 7, 2019

Related U.S. Application Data

(62) Division of application No. 15/329,703, filed as application No. PCT/JP2015/071506 on Jul. 29, 2015, now abandoned.

(30) Foreign Application Priority Data

Aug. 7, 2014 (JP) ................. 2014-161386

(51) Int. Cl.
| | |
|---|---|
| C09D 133/02 | (2006.01) |
| C09D 7/40 | (2018.01) |
| B05D 5/00 | (2006.01) |
| B05D 7/24 | (2006.01) |
| C09D 201/00 | (2006.01) |
| C09D 5/00 | (2006.01) |
| C09D 7/65 | (2018.01) |
| C08J 7/04 | (2020.01) |
| B32B 27/18 | (2006.01) |
| C09D 201/02 | (2006.01) |
| C23C 16/44 | (2006.01) |
| C08L 33/02 | (2006.01) |

(52) U.S. Cl.
CPC ............ *C09D 133/02* (2013.01); *B05D 5/00* (2013.01); *B05D 7/24* (2013.01); *B32B 27/18* (2013.01); *C08J 7/0423* (2020.01); *C09D 5/00* (2013.01); *C09D 7/40* (2018.01); *C09D 7/65* (2018.01); *C09D 201/00* (2013.01); *C09D 201/02* (2013.01); *C23C 16/44* (2013.01); *C08L 33/02* (2013.01)

(58) Field of Classification Search
CPC ... C09D 5/00; C09D 7/40; C09D 7/65; C09D 133/02; C09D 201/00; C09D 201/02; B05D 5/00; B05D 7/24; B32B 27/18
See application file for complete search history.

(56) References Cited

U.S. PATENT DOCUMENTS

| | | | |
|---|---|---|---|
| 4,919,984 | A | 4/1990 | Maruhashi et al. |
| 6,461,694 | B1 | 10/2002 | Nishikawa et al. |
| 9,493,348 | B2 | 11/2016 | Ramadas et al. |
| 2011/0152100 | A1 | 6/2011 | Parrish et al. |
| 2015/0368498 | A1 | 12/2015 | Okuyama et al. |
| 2016/0243801 | A1 | 8/2016 | Okuyama et al. |

FOREIGN PATENT DOCUMENTS

| | | |
|---|---|---|
| CN | 102166511 A | 8/2011 |
| DE | 4224830 A1 | 5/1994 |
| JP | 61-011339 A | 1/1986 |
| JP | 2004-018536 A | 1/2004 |
| JP | 2004-058463 A | 2/2004 |
| JP | 2009-090633 A | 4/2009 |
| JP | 2010-511267 A | 4/2010 |
| JP | 2010-210127 A | 9/2010 |
| JP | 2011-131395 A | 7/2011 |
| WO | 2014/123197 A1 | 8/2014 |
| WO | 2015/053340 A1 | 4/2015 |

OTHER PUBLICATIONS

Machine translation of JP 2010-210127. (Year: 2010).*
International Search Report of PCT/JP2015/071506, dated Oct. 27, 2015.
Extended European Search Report dated Feb. 12, 2018, issued by the European Patent Office in counterpart European application No. 15829493.4.
Communication dated Apr. 28, 2018, from the State Intellectual Property Office of People's Republic of China in counterpart Application No. 201580042531.X.
English language translation of JP 2010-210127, pp. 1-11, Feb. 7, 2018.

* cited by examiner

*Primary Examiner* — Edward J Cain
(74) *Attorney, Agent, or Firm* — Sughrue Mion, PLLC (57) ABSTRACT

A coating formed on a surface of a base material, the coating composition containing an ionic polymer (a), a hygroscopic agent (b) and a solvent, the hygroscopic agent (b) being a granular crosslinked product of a monovalent metal salt of a poly(meth)acrylic acid and being contained in an amount of 75 to 700 parts by mass per 100 parts by mass of the ionic polymer (a), and the coating having a haze of 5% or less and a maximum surface roughness Ra (JIS B-0601-1994) of 0.1 μm or less.

3 Claims, 2 Drawing Sheets

COATING COMPOSITION

CROSS REFERENCE TO RELATED APPLICATIONS

This application is a Rule 53(b) Divisional Application of U.S. application Ser. No. 15/329,703 filed Jan. 27, 2017, which is a National Stage of International Application No. PCT/JP2015/071506 filed Jul. 29, 2015, claiming priority based on Japanese Patent Application No. 2014-161386 filed Aug. 7, 2014, the contents of all of which are incorporated herein by reference in their entirety.

TECHNICAL FIELD

This invention relates to a coating composition capable of forming a hygroscopic coating on the surfaces of various kinds of base materials. More specifically, the invention also relates to a coating formed by using the coating composition.

BACKGROUND ART

Leakage of electric charge must be avoided in a variety of kinds of electronic devices that have been developed and put into practical use in recent years, such as organic electroluminescent (organic EL) devices, solar cells, touch panels, electronic papers, etc. Therefore, a high degree of water barrier property is required for the plastic base materials that are used for forming circuit boards and for the plastic base materials such as films that are used for sealing the circuit boards.

The water barrier property can be realized by providing a hygroscopic coating in which a hygroscopic agent is dispersed.

For instance, a patent document 1 is disclosing a gas barrier laminate obtained by forming an inorganic barrier layer on the surface of a plastic base material, and forming, on the inorganic barrier layer, a sealing layer (hygroscopic film) in which nano particles such as of a metal oxide or carbon nano tubes are dispersed as a hygroscopic agent.

Further, a patent document 2 proposes a gas barrier laminate (film) obtained by forming an inorganic barrier layer, an organic layer and a water-trapping layer (hygroscopic film) on abase film. Here, a hygroscopic material such as silica gel or aluminum oxide is dispersed in water-trapping layer (hygroscopic film) and in a high molecular binder such as polyamide.

Further, a patent document 3 discloses a gas barrier laminate comprising a plastic base material on which are deposited a gas barrier film and a hygroscopic layer (hygroscopic film), the hygroscopic layer containing an alkylene oxide, nano particles of acrylate or an organic metal complex.

While studying many such hygroscopic films, the present inventors have discovered that if a matrix of an ionic polymer contains dispersed therein a hygroscopic agent having such a hygroscopic property that the humidity thereof that is attained is lower than the humidity of the matrix, then a very high water barrier property is exhibited, and have previously filed a patent application (PCT/JP2014/052788). Then the inventors have furthered the study and have discovered that if a crosslinked product of a monovalent metal salt of an acrylic acid is used and if the hygroscopic agent is added in a predetermined range, then the hygroscopic film exhibits a high hygroscopic property (water shut-off property) as well as excellent transparency and surface smoothness.

PRIOR ART DOCUMENTS

Patent Documents

Patent document 1: JP-A-2010-511267
Patent document 2: JP-A-2009-90633
Patent document 3: JP-A-2011-131395

OUTLINE OF THE INVENTION

Problems that the Invention is to Solve

It is, therefore, an object of the present invention to provide a coating composition capable of forming a coating that exhibits excellent hygroscopic property, transparency and surface smoothness.

Another object of the present invention is to provide a coating formed by using the above coating composition.

A further object of the present invention is to provide a coating that can be favorably used as a defogging film or a water shut-off film.

Means for Solving the Problems

According to the present invention, there is provided a coating composition comprising an ionic polymer (a), a hygroscopic agent (b) and a solvent, the hygroscopic agent (b) being a granular crosslinked product of a monovalent metal salt of a poly(meth)acrylic acid and being contained in an amount of 75 to 700 parts by mass per 100 parts by mass of the ionic polymer (a).

The coating composition of the present invention is used, particularly preferably, for forming a defogging film or a water shut-off film. As the ionic polymer (a), there can be used a cationic polymer (a1) or an anionic polymer (a2).

According to the present invention, further, there is provided a coating formed on the surface of a base material, the coating comprising a matrix of an ionic polymer (a) and a hygroscopic agent (b) dispersed in the matrix, and the hygroscopic agent (b) being a granular crosslinked product of a monovalent metal salt of a poly(meth)acrylic acid and being contained in an amount of 75 to 700 parts by mass per 100 parts by mass of the ionic polymer (a).

The coating is formed by applying the above-mentioned coating composition on the surface of a base material followed by heating to remove the solvent. The coating has a haze of 5% or less and a maximum surface roughness Ra (JIS B-0601-1994) of 0.1 μm or less.

The coating is favorably used as a water shut-off film or a defogging film.

Effects of the Invention

Upon being applied onto the surface of a predetermined base material and heated, the coating composition of the invention forms a coating of a structure in which the matrix is formed by the ionic polymer (a) and hygroscopic agent (b) is dispersed in the matrix. As proved by the results of experiments in Examples appearing later, the coating exhibits a very high hygroscopic property and undergoes a change in volume (swells) in a very suppressed manner despite it has absorbed humidity.

The coating, further, features a high degree of transparency and surface smoothness.

For example, as demonstrated in Examples appearing later, the coating formed by using the coating composition of the present invention has a haze of 5% or less, a very high degree of transparency, a maximum surface roughness Ra (JIS B-0601-1994) of 0.1 μm or less and a high degree of surface smoothness.

The coating having the above-mentioned properties is favorably used, for example, as a defogging film. Namely, upon coating the surfaces of mirrors, windowpanes and transparent containers with the coating composition, the water droplets that happen to adhere on the surfaces of the coatings turn into a thin and smooth water film. This, therefore, effectively alleviates irregular reflection or scattering of light caused by water droplets; i.e., fogging due to the adhesion of water droplets is alleviated. That is, the coating serves as a defogging film and effectively suppresses a decrease in the optical properties caused by the fogging on the base materials.

Further, on a transparent substrate (e.g., glass substrate) holding a luminous layer of an organic electroluminescent device (organic EL device), the coating formed thereon works as a water shut-off film by absorbing very small amounts of water in the device, and effectively alleviates the deterioration of the luminous layer caused by the moisture.

MODES FOR CARRYING OUT THE INVENTION

The coating composition of the present invention contains the ionic polymer (a), hygroscopic agent (b), solvent and, as required, other additives. By applying the coating composition onto the surface of a predetermined base material and by heating the coating composition to remove the solvent, there is formed a coating thereof. The coating has a structure in which the ionic polymer (a) forms a matrix in which there is dispersed the hygroscopic agent (b) which is a granular crosslinked product of a monovalent metal salt of a poly (meth)acrylic acid. Due to this dispersion structure, the coating exhibits excellent hygroscopic property which is a basic property thereof.

<Principle of Hygroscopic Property>

Hygroscopic property of the coating formed by using the coating composition of the invention will be described with reference to FIG. 1.

Figure 1:
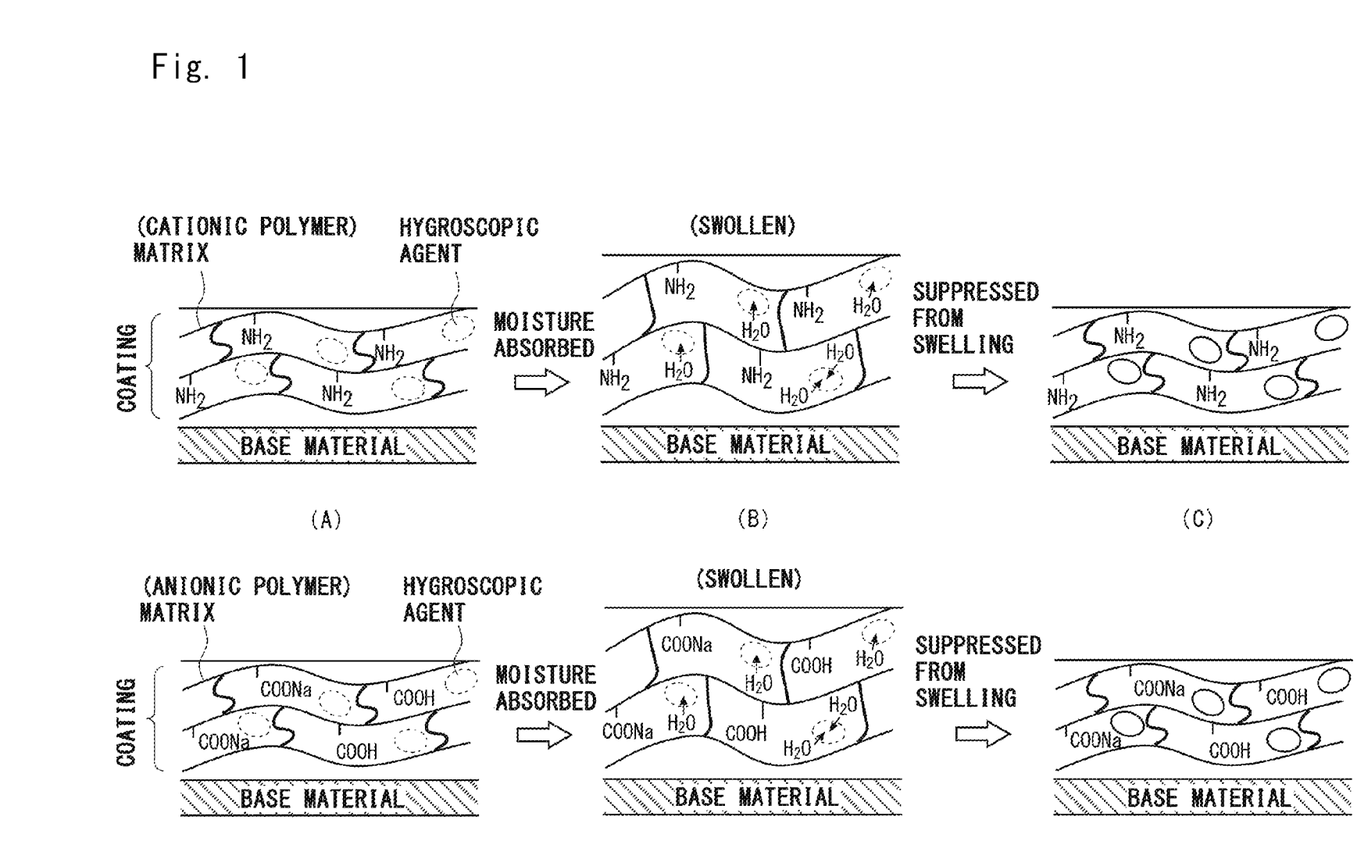
[FIG. 1] is a view illustrating hygroscopic property of a coating formed by using a coating composition of the present invention.

In the coating formed on a predetermined base material shown in FIG. 1, the matrix is formed by an ionic polymer or, concretely, by a cationic polymer (ionic groups are $NH_2$ group) or by an anionic polymer (ionic groups are COONa groups and COOH groups). In the polymer, there is dispersed, as a hygroscopic agent, the granular crosslinked product of a monovalent metal salt of a poly(meth)acrylic acid (see FIG. 1(A)).

That is, with the above-mentioned coating formed on the predetermined base material, a very small amount of water that has permeated through the base material or water in the atmosphere is absorbed by the matrix that contains hydrophilic cationic groups or anionic groups (see FIG. 1(B)). Namely, the matrix by itself exhibits a high hygroscopic property.

Here, if the matrix simply absorbs water, then water that is absorbed will be easily released due to a change in environment such as a rise in temperature. Besides, water that has infiltrated widens the gaps among the polymer molecules that are forming the matrix. As a result, the coating swells and loses dimensional stability.

In the present invention, on the other hand, the granular crosslinked product of the monovalent metal salt of the poly(meth)acrylic acid dispersed as the hygroscopic agent in the matrix has a hygroscopic property larger (attains at a humidity lower) than that of the cationic polymer or the anionic polymer that is forming the matrix. Therefore, water absorbed in the matrix is, further, trapped by the hygroscopic agent (see FIG. 1(C)). This effectively suppresses the coating from swelling despite it has absorbed the water molecules. Besides, the water molecules are confined in the coating (matrix); i.e., release of water from the coating is effectively prevented. As described above, the coating formed by using the coating composition of the present invention has double functions of trapping water and confining water therein owing to its high hygroscopic capability. The coating, therefore, exhibits excellent hygroscopic property and anti-swelling property (dimensional stability).

For instance, in Examples appearing later, the below-mentioned experiments have been carried out in order to prove that water trapped by the matrix is, further, confined in the hygroscopic agent.

That is, 0.5 g of a material to be measured was dried at 140° C. for one hour. Thereafter, the material was put together with a wireless thermometer/hygrometer (Hygroclone manufactured by KN Laboratories, Inc.) into a water-impermeable steel foil-laminated cup of a volume of 85 $cm^3$ in an atmosphere of 30° C. 80% RH. The container was sealed at its mouth portion with a lid of an aluminum foil-laminated film, and was left to stand for one day. The container was, thereafter, left to stand at temperatures of −20, 5, 22, 30 and 40° C. for 3 hours each, and the relative humidities in the cup were regarded to be the attained humidities at each of these temperatures.

Figure 2:
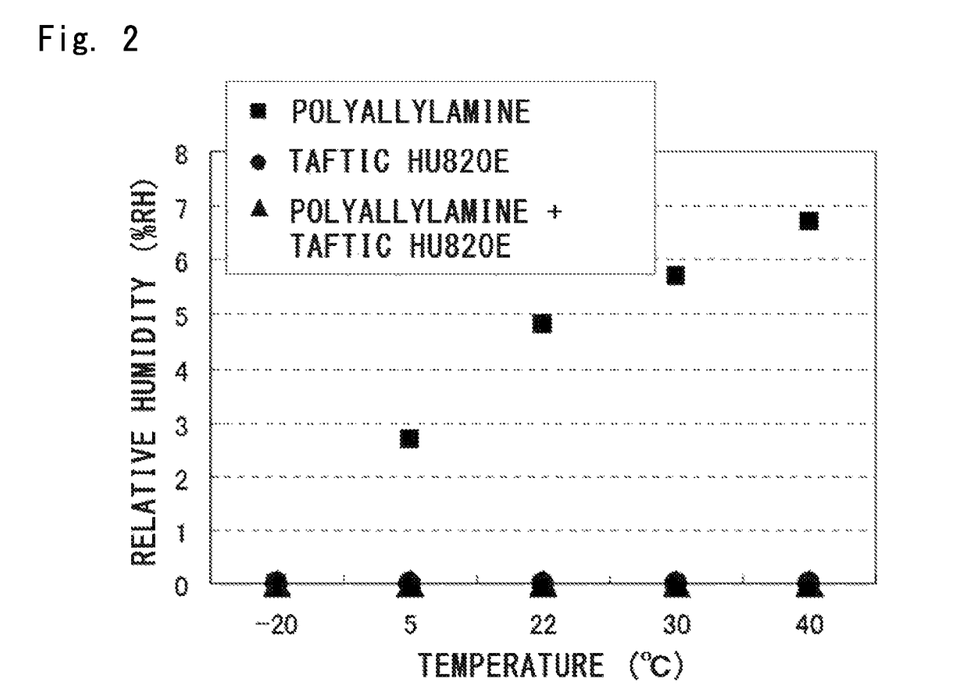
[FIG. 2] is a graph showing degrees of humidity attained by a cationic polymer, a hygroscopic agent and a mixture of the cationic polymer and the hygroscopic agent at a ratio of 1:1 at different temperatures.

FIG. 2 shows humidities attained by the cationic polymer (polyallylamine), by the hygroscopic agent (TAFTIC HU820E) and by a mixture of the cationic polymer and the hygroscopic agent at a ratio of 1:1 at different temperatures. With the cationic polymer, the humidity in the container increased accompanying an increase in the temperature. With the hygroscopic agent and the mixture of the cationic polymer and the hygroscopic agent, on the other hand, the humidity in the container could be lowered to near the absolute dry state. The mixture exhibited the hygroscopic capability equivalent to the simple hygroscopic agent telling the fact that water absorbed by the cationic polymer was not released to the exterior despite of a rise in the temperature but remained trapped by the hygroscopic agent that has a larger hygroscopic property (i.e., attains a lower humidity).

As will be understood from FIG. 1, further, with the crosslinked structure being introduced in the matrix, gaps among the molecules of the ionic polymer is suppressed from expanding despite water has infiltrated. Therefore, the coating is more effectively suppressed from swelling despite it has absorbed water.

<Ionic Polymer (a)>

In the invention, the ionic polymer (a) is a component that forms the matrix of the coating. As also shown in FIG. 1, the ionic polymer (a) can be either a cationic polymer (a1) or an anionic polymer (a2).

Cationic Polymer (a1);

In the invention, the cationic polymer (a1) used as the matrix component in the coating is a polymer having a cationic group that could become a positive electric charge in water, such as primary to tertiary amino group, quaternary ammonium group, pyridyl group, imidazole group or quaternary pyridinium group in the molecules thereof. The cationic polymer of this kind is capable of forming a hygroscopic matrix since the cationic group therein has a strong nucleophilic action and traps water by the hydrogen bond.

The amount of the cationic groups in the cationic polymer (a1) may, usually, be such that the water-absorbing ratio (JIS K-7209-1984) of the hygroscopic matrix that is formed is 20% or more and, specifically, 30% to 45% in an atmosphere of a humidity of 80% RH and 30° C.

As the cationic polymer (a1), further, there can be used at least one kind of cationic monomer as represented by an amine type monomer, such as allylamine, ethyleneimine, vinylbenzyltrimethylamine, [4-(4-vinylphenyl)-methyl]-trimethylamine or vinylbenzyltriethylamine; a nitrogen-containing heterocyclic monomer such as vinylpyridine or vinylimidazole; or salts thereof, suitably being polymerized or copolymerized with other monomers copolymerizable therewith and, further, as required, partly neutralized by the treatment with an acid.

As the other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above cationic monomer, further, it is also allowable to use a monomer having a functional group capable of introducing the cationic functional group, such as styrene, bromobutylstyrene, vinyltoluene, chloromethylstyrene, vinylpyridine, vinylimidazole, α-methylstyrene or vinyl naphthalene. After the polymerization, the treatment is executed such as amination or alkylation (conversion into a quaternary ammonium salt) to obtain the cationic polymer (a1).

In the invention, among the above cationic polymers (a1), it is desired to use, specifically, the polyallylamine from the standpoint of forming the film.

In the invention which uses the above cationic polymer (a1) as the matrix component, a certain kind of crosslinking agent is used to introduce a crosslinked structure in the matrix, however, without using any particular adhesive offering an advantage of improved adhesiveness to various kinds of base materials coated with the coating composition.

The polymerization for forming the cationic polymer (a1) is, usually, carried out based on the radical polymerization by heating while using a polymerization initiator.

As the polymerization initiator, though not specifically limited, there can be representatively used organic peroxides such as octanoyl peroxide, lauroyl peroxide, t-butylperoxy-2-ethyl hexanoate, benzoyl peroxide, t-butylperoxyisobutylate, t-butylperoxy laurate, t-hexylperoxy benzoate, and di-t-butyl peroxide. Usually, the polymerization initiator is used in an amount of about 0.1 to about 20 parts by mass and, specifically, about 0.5 and about 10 parts by mass per 100 parts by mass of the cationic monomer (or a monomer capable of introducing the cationic groups).

The cationic polymer (a1) is obtained by conducting the polymerization as described above. If there is used a monomer capable of introducing the cationic functional group, however, a treatment may be conducted for introducing cationic groups, such as amination or alkylation treatment after the polymerization has been finished.

Anionic polymer (a2);

In the invention as shown in FIG. 1, it is also allowable to use the anionic polymer (a2) as the ionic polymer (a) for forming the matrix in the coating.

The anionic polymer (a2) is a polymer which has in the molecules thereof an anionic functional group that could become a negative electric charge in water, such as carboxylic acid group, sulfonic acid group or phosphonic acid group, or an acid base thereof that is partly neutralized. The anionic polymer is capable of forming a hygroscopic matrix since the functional group therein traps water due to the hydrogen bond.

The amount of the anionic functional groups in the anionic polymer (a2) may differ depending on the kind of the functional groups but is, usually, in such an amount that the water-absorbing ratio (JIS K-7209-1984) of the hygroscopic matrix that is formed is not 20% or more and is, specifically, 30% to 45% in an atmosphere of a humidity of 80% RH and 30° C.

The anionic polymer (a2) having the above functional group is obtained by polymerizing or copolymerizing, with other monomers copolymerizable therewith, at least one of the anionic monomers as represented by carboxylic acid monomers such as methacrylic acid, acrylic acid and maleic anhydride; sulfonic acid monomers such as α-halogenated vinylsulfonic acid, styrenesulfonic acid and vinylsulfonic acid; phosphonic acid monomers such as vinylphosphoric acid, etc.; or salts of monomers thereof, followed, as required, by a partial neutralization with an alkali.

As the other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above anionic monomers, it is also allowable to obtain the anionic polymer (a2) by polymerizing an ester of the above anionic monomer or a monomer having a functional group capable of introducing the anionic functional monomer, such as styrene, vinyltoluene, vinylxylene, α-methylstyrene, vinylnaphthalene or α-halogenated styrenes followed by a treatment such as hydrolysis, sulfonation, chlorosulfonation or phosphoniation.

In the invention, a preferred example of the anionic polymer (a2) is a poly (meth) acrylic acid and a partly neutralized product thereof (e.g., the one which is partly an Na salt).

The polymerization for forming the anionic polymer (a2) is, usually, carried out based on the radical polymerization by heating while using a polymerization initiator.

As the polymerization initiator, though there is no particular limitation, there can be represented peroxides such as octanoyl peroxide, lauroyl peroxide, t-butylperoxy-2-ethyl hexanoate, benzoyl peroxide, t-butyl peroxyisobutylate, t-butyl peroxylaurate, t-hexyl peroxybenzoate and di-t-butyl peroxide. Usually, the polymerization initiator is used in an amount of about 0.1 to about 20 parts by mass and, specifically, about 0.5 to 10 parts by mass per 100 parts by mass of the above-mentioned anionic monomer (or the monomer capable of introducing anionic groups).

The anionic polymer (a2) is obtained through the polymerization as described above. However, if there is used the monomer capable of introducing the anionic functional groups, the treatment may be conducted for introducing the anionic groups, such as hydrolysis, sulfonation, chlorosulfonation or phosphoniation after the polymerization has been finished.

<Hygroscopic Agent (b)>

The coating composition of the invention uses a granular crosslinked product of a monovalent metal salt of a poly(meth)acrylic acid as the hygroscopic agent (b) that is to be dispersed in the matrix of the ionic polymer (a).

The granular crosslinked product attains a humidity lower than the humidity attained by the ionic polymer (a) (cationic polymer (a1) or anionic polymer (a2)) that forms the matrix, i.e., attains a humidity which is not 6% or lower under an environmental condition of a humidity of 80% RH and a temperature of 30° C. and thus has a very high hygroscopic property. That is, the coating formed by using the coating composition of the invention contains dispersed therein a hygroscopic agent having a higher hygroscopic property than that of the matrix. Therefore, the moisture absorbed by the hygroscopic matrix is readily trapped by the hygroscopic component, and water that is absorbed is effectively confined in the matrix.

As a result, in the invention, water trapped in the coating is effectively suppressed from being released; i.e., the coating not only exhibits its excellent hygroscopic property but is also effectively suppressed from swelling (suppressed from undergoing a dimensional change) despite of having absorbed water therein.

The crosslinked particles of the monovalent metal salt of the poly(meth)acrylic acid are fine spherical particles obtained by polymerizing and curing a (meth)acrylic monomer containing a trifunctional or more highly functional (meth)acrylate by the suspension polymerization or the emulsion polymerization. The crosslinked particles have a mean primary particle diameter $D_{50}$ in a range of 100 nm or less and, specifically, 80 nm or less calculated as volume as measured by, for example, the laser diffraction light scattering method. The crosslinked particles can be homogeneously and finely dispersed in the ionic polymer (a) that forms the matrix, do not impair the transparency of the ionic polymer (a), have large specific surface areas and, therefore, have a very high hygroscopic capability and hence exhibit excellent hygroscopic property as described above.

In the crosslinked particles of the monovalent metal salt of the poly(meth)acrylic acid, the metal salt is, usually, an Na salt or a K salt. For instance, the crosslinked sodium polyacrylate fine particles (mean particle diameter of about 70 nm) in the form of a colloidal dispersion solution (pH=10.4) have been placed in the market by Toyobo Co., Ltd. in the trade name of TAFTIC HU-820E. It is also desired to use crosslinked potassium polyacrylate fine particles of which is 80% or more of the carboxyl groups have been neutralized with the potassium salt.

In the invention, it is very important that the hygroscopic agent (b) (crosslinked particles of the monovalent metal salt of the poly (meth) acrylic acid) is used in an amount of 75 to 700 parts by mass and, specifically, 100 to 600 parts by mass per 100 parts by mass of the ionic polymer (a). That is, by using the hygroscopic agent (b) in the above-mentioned amount, it is made possible to form the coating having excellent transparency and a smooth surface of a surface roughness Ra (maximum roughness) of 0.1 µm or more and, specifically, 0.08 µm or more.

If, for example, the amount of the hygroscopic agent (b) is smaller than the above range, transparency of the coating is impaired; i.e., the coating becomes white and, besides, its smoothness is impaired. Probably, if the amount of the hygroscopic agent (b) is small, it is considered that the crosslinked particles of the monovalent metal salt of the poly(meth)acrylic acid are distributed in a concentrated manner or are aggregated around the ionic groups of the ionic polymer. As a result, the surface of the coating becomes rugged to a large extent, loses smoothness and, at the same time, causes light to be irregularly reflected or scattered to a large degree also causing the transparency to be impaired.

If the hygroscopic agent (b) is added in an amount larger than the above range, on the other hand, it is probable that applicability of the coating composition tends to be impaired.

Namely, upon setting the amount of the hygroscopic agent (b) to lie within the above range, fine particles are distributed in the coating in a state of being regularly arranged. As a result, excellent transparency and surface smoothness can be secured.

<Solvent>

There is no particular limitation on the solvent used for the coating composition of the present invention provided it can be volatilized and removed by heating at a relatively low temperature. There can be used, for example, alcoholic solvents such as methanol, ethanol, propyl alcohol and butanol; ketone solvents such as acetone and methyl ethyl ketone; mixed solvents of the above solvents with water; water; and aromatic hydrocarbon solvents such as benzene, toluene and xylene. Specifically, if the coating composition is to be blended with a crosslinking agent that will be described later, it is desired to use water or a mixed solvent that contains water in order to accelerate the hydrolysis of a silane compound that has an alkoxysilyl group in the crosslinking agent.

Here, the solvent is used in such an amount that the coating composition acquires a viscosity suited for being applied.

<Other Blending Agents>

The coating composition of the present invention can be blended with a crosslinking agent and an adhesion improving agent depending on the kind of the ionic polymer (a) that is used as the matrix component.

The crosslinking agent is used for introducing the crosslinked structure into the matrix in the coating. By using the crosslinking agent, it is allowed to maintain the mechanical strength without lowering the hygroscopic capability and, at the same time, to further improve the dimensional stability. That is, with the crosslinked structure being introduced into the hygroscopic matrix formed by using the ionic polymer (a), if water is absorbed by the matrix, molecules of the ionic polymer (matrix) are constrained by each other due to the crosslinking, and an increased function is exhibited to suppress a change in the volume caused by swelling (absorption of water).

If, for example, the cationic polymer (a1) is used as the ionic polymer (a) that forms the matrix, then there can be used, as the crosslinking agent, a compound that has a crosslinking functional group (e.g., epoxy group) capable of reacting with the cationic group possessed by the cationic polymer (a1) and a functional group (e.g., alkoxysilyl group) capable of forming a siloxane structure in the crosslinked structure through the hydrolysis and the dehydration-condensation. Specifically, there can be used a silane compound represented by the following formula (1):

$$X—SiR^1{}_n(OR^2)_{3-n} \qquad (1)$$

wherein, X is an organic group having an epoxy group at the terminal thereof, $R^1$ and $R^2$ are, respectively, methyl groups, ethyl groups or isopropyl groups, and n is 0, 1 or 2.

The silane compound of the formula (1) has an epoxy group and an alkoxysilyl group as functional groups, and the epoxy group undergoes the addition reaction with a functional group (e.g., $NH_2$ group) of the cationic polymer (a1). On the other hand, the alkoxysilyl group forms a silanol group (SiOH group) through the hydrolysis thereof, forms the siloxane structure through the condensation reaction thereof and, finally, forms the crosslinked structure among the cationic polymer chains. Therefore, the matrix formed by the cationic polymer (a1) has, introduced therein, the crosslinked structure having the siloxane structure. On the other hand, if, for example, the base material on which the coating composition is applied is an inorganic material such as glass or the like and has, on the surface thereof, an MOH group (M: metal element) such as SiOH group (silanol group), the silanol group formed by the hydrolysis of the alkoxysilyl group undergoes the dehydration and condensation with this group and strongly bonds thereto. As a result, the coating adheres more closely to the base material.

Besides, in this case, the ionic polymer is the cationic polymer (a1). Therefore, the coating composition becomes alkaline and accelerates the addition reaction of the cationic group with the epoxy group, and the dehydration and condensation between the silanol groups or of the cationic group with the MOH group on the surface of the base material.

By using the compound of the above formula (1) as the crosslinking agent, therefore, it is made possible to introduce the crosslinked structure into the matrix and, depending on the kind of the base material on which the coating composition is applied, to improve close adhesion between the coating and the base material without using any particular adhesive.

As the organic group X having the epoxy group in the above formula (1), there can be representatively used a γ-glycidoxyalkyl group. For instance, a γ-glycidoxypropyltrimethoxysilane or a γ-glycidoxypropylmethyldimethoxysilane is preferably used as the crosslinking agent.

There can be, further, favorably used a crosslinking agent in which the epoxy group in the above formula (1) is an alicyclic epoxy group like epoxycyclohexyl group. For instance, if there is used, as the cross linking agent, a compound that has an alicyclic epoxy group like β-(3,4-epoxycyclohexyl)ethyltrimethoxysilane, an alicyclic structure is introduced together with the siloxane structure into the crosslinked structure of the matrix.

Introduction of the alicyclic structure makes it possible to more effectively exhibit the function of the matrix which is to form a spatial mesh structure adapted for adsorbing the moisture.

In the present invention, further, it is also allowable to use, as the crosslinking agent, a compound that has a plurality of epoxy groups and alicyclic groups, e.g., a diglycidyl ester represented by the following formula (2):

(2)

wherein, G is a glycidyl group and A is a divalent hydrocarbon group having an aliphatic ring, such as cycloalkylene group.

A representative example of the diglycidyl ester is expressed by the following formula (2-1).

(2-1)

That is, use of the diglycidyl ester of the formula (2) as the crosslinking agent is effective in introducing the alicyclic structure into the crosslinked structure and in forming the spatial mesh structure in the matrix that is adapted for absorbing the moisture.

In the invention, the amount of the above-mentioned crosslinking agent that is used when the cationic polymer (a1) is used, is, desirably, 5 to 60 parts by mass and, specifically, 15 to 50 parts by mass per 100 parts by mass of the cationic polymer (a1). Here, it is desired that at least 70% or more by weight and, preferably, 80% or more by weight of the crosslinking agent is the silane compound of the above formula (1).

If the crosslinking agent is used in too large amounts, the coating composition becomes mechanically brittle and less easy to handle. If the coating material is prepared, therefore, the viscosity increases so quickly that an effective pot life cannot be guaranteed. By using the crosslinking agent in too small amounts, on the other hand, it may become difficult to guarantee the durability (e.g., mechanical strength) if the coating is exposed to severe environmental conditions (e.g., highly humid conditions). Moreover, if the silane compound of the above formula (1) is used in too small amounts, the function may not be fully exhibited for improving the adhesiveness of the coating to the base material.

If the anionic polymer (a2) is used as the ionic polymer (a), then there can be used, as the crosslinking agent, a compound having two or more crosslinking functional groups (e.g., epoxy groups) capable of reacting with the anionic groups possessed by the anionic polymer (a2). Specifically, it is desired to use the diglycidyl ester represented by the above formula (2), i.e., (2)

wherein, G is a glycidyl group, and A is a divalent hydrocarbon group having an aliphatic ring, such as cycloalkylene group.

Namely, the diglycidyl ester is the same as the one that was used for introducing the alicyclic structure into the crosslinked structure of when the cationic polymer (a1) was used. By using the diglycidyl ester, two epoxy groups react with the anionic groups in the anionic polymer (a2), and the crosslinked structure is formed in the matrix, the crosslinked structure having the alicyclic structure formed by the divalent group A.

Due to the crosslinked structure that includes the alicyclic structure, molecules of the anionic polymer (a2) are constrained, and the swelling is suppressed. Specifically, from the standpoint of forming the spatial mesh structure adapted to absorbing the moisture, it is desired that the aliphatic ring included in the divalent organic group A is the cyclohexane ring. More desirably, the diglycidyl ester has two ester groups formed at positions neighboring to each other on the cyclohexane ring. The diglycidyl ester of this structure is represented by the above-mentioned formula (2-1).

Into the hygroscopic matrix formed by using the anionic polymer (a2), in particular, there is introduced the cross-linked structure by using the above-mentioned crosslinking agent in order to improve the dimensional stability as a result of suppressing the swelling and to, further, improve the hygroscopic property.

Namely, in the case of the anionic polymer (a2), water is trapped relying on the hydrogen bond only unlike the case of the cationic polymer (a1). By forming the hydrophobic portions like the alicyclic structure in the mesh structure, therefore, it is allowed to improve the hygroscopic effect at the hydrophilic portions.

In the invention, the amount of the above-mentioned crosslinking agent that is used when the anionic polymer (a2) is used, is, desirably, 1 to 50 parts by mass and, specifically, 10 to 40 parts by mass per 100 parts by mass of the anionic polymer (a2). If the crosslinking agent is used in too large amounts, the coating may become brittle. Besides, if the coating composition is prepared, the viscosity increases so quickly that an effective pot life cannot be guaranteed. By using the crosslinking agent in too small amounts, on the other hand, it may become difficult to guarantee the durability (e.g., mechanical strength) if the coating is exposed to severe environmental conditions (e.g., highly humid conditions).

In the invention, further, when the anionic polymer (a2) is used as the ionic polymer (a), use of the adhesion improving agent is particularly effective in forming the coating on the inorganic base material that comprises an inorganic material such as glass or metal.

That is, the adhesion improving agent has functional groups that react with the surface of the inorganic base material and with the anionic polymer (a2), i.e., has an epoxy group and an alkoxysilyl group. As the adhesion improving agent, for example, there is preferably used the silane compound represented by the above-mentioned formula (1):

$$X\text{---}SiR^1{}_n(OR^2)_{3-n} \tag{1}$$

wherein, X is an organic group having an epoxy group at the terminal thereof, $R^1$ and $R^2$ are, respectively, methyl groups, ethyl groups or isopropyl groups, and n is 0, 1 or 2.

The above silane compound is the same compound as the one that is used as the crosslinking agent when the cationic polymer (a1) is used.

In the silane compound, the silanol group (SiOH group) formed by the hydrolysis of the alkoxysilyl group undergoes the dehydration and condensation with the MOH (M is a metal element such as Si) distributed in the surface of the inorganic base material. Therefore, the siloxane structure is introduced into the matrix, and the adhesive agent (silane compound) closely bonds to the surface of the inorganic base material due to the siloxane bond. Besides, the epoxy group in the silane compound undergoes the reaction (esterification) with the acid group (e.g., COOH) or a salt thereof (e.g., COONa) possessed by the anionic polymer (a2), and bonds thereto. Therefore, the adhesion improving agent also bonds to the matrix in the coating.

Thus the adhesion improving agent improves the degree of adhesion and the strength of adhesion between the coating and the inorganic base material. As a result, the coating is effectively prevented from peeling, and maintains its properties over extended periods of time.

Among the silane compounds of the above formula (1), it is desired to use those having a plurality of alkoxysilyl groups (n is 0 or 1 in the formula (1)), such as γ-glycidoxypropyltrimethhoxysilane and γ-glycidoxypropylmethyldimethoxysilane. Further, the most desired adhesion improving agents are those in which the epoxy group is an alicyclic epoxy group like epoxycyclohexyl group, such as β-(3,4-epoxycyclohexyl)ethyltrimethoxysilane and the like.

In the invention, it is desired that the adhesion improving agent is used in an amount of 0.1 to 10 parts by mass and, specifically, 1 to 8 parts by mass per 100 parts by mass of the anionic polymer (a2) such that the properties thereof are exhibited to a sufficient degree without impairing the hygroscopic properties mentioned above.

The coating composition of the invention can be, further, blended with a non-ionic polymer in a suitable amount in order to adjust the viscosity of the coating composition or to adjust the water-absorbing ratio of the formed hygroscopic matrix to lie in a suitable range.

As the non-ionic polymer, there can be exemplified saturated aliphatic hydrocarbon polymers such as polyvinyl alcohol, ethylene-propylene copolymer and polybutylene; styrene polymers such as styrene-butadiene copolymer, etc.; polyvinyl chloride; as well as those of the above polymers that are, further, copolymerized with various kinds of comonomers (e.g., styrene monomers such as vinyl toluene, vinyl xylene, chlorostyrene, chloromethylstyrene, α-methylstyrene, α-halogenated styrene, and α,β,β'-trihalogenated styrene; monoolefins such as ethylene and butylene; and conjugated diolefins such as butadiene and isoprene).

<Forming the Coating and Its Use>

The above coating composition is applied onto the surfaces of various base materials such as of plastic material, glass and metal, and is heated in a heating oven to remove the solvent, and a coating thereof is formed. The temperature of heating is, usually, about 80 to about 160° C. and the time of heating is, usually, from about several seconds to about several minutes though it may vary depending upon the coating composition, capability of the heating oven and the thickness of the coating.

The solvent is removed by heating and coating is formed. If the coating composition is blended with a crosslinking agent, a crosslinked structure is introduced by heating into the matrix formed by the ionic polymer (a). Further, if the coating composition is applied onto the base material (e.g., glass base material) having MOH (M: metal element such as Si) in the surface thereof, the crosslinking agent reacts with the MOH, and close adhesion is improved between the coating and the base material.

The thickness of the coating is not specifically limited and may be suitably set depending on the use and the required properties.

As described above already, the coating has excellent hygroscopic property, dimensional stability, transparency and surface smoothness. By utilizing these properties, therefore, the coating is used for a variety of applications.

For a variety of devices such as organic EL devices and solar cells that require transparency, for example, the coating composition can be used as a water-barrier agent by utilizing the transparency, dimensional stability and hygroscopic property of the coating thereof.

The coating composition (water-barrier agent) is applied onto a transparent base plate such as of a transparent plastic material or a glass to forma coating thereof. That is, the coating works as a water shut-off film while absorbing very small amounts of water in the device. Therefore, electronic circuitry formed on the transparent base plate is prevented from being deteriorated with water.

If the transparent plastic base plate is to be coated with the coating composition, it is desired that a silicon oxide has been deposited in advance on the surface of the transparent plastic base plate by the CVD method to further improve the water shut-off property.

The coating composition can be, further, used as a defogging agent by utilizing the transparency, hygroscopic property, dimensional stability and surface smoothness of the coating that is formed. That is, the coating composition is applied on the surface of a mirror, a windowpane, a transparent packing material (e.g., polyethylene terephthalate bottle) or the like to form a coating thereof which then serves as a defogging film. Namely, water droplets may happen to adhere to the smooth surface of the transparent coating. The water droplets, in this case, spread on the surface to form a thin liquid film thereof due to a high degree of hygroscopic property of the coating. This suppresses irregular reflection or scattering of light caused by the adhesion of water droplets. Namely, this effectively prevents the fogging caused by the irregular reflection or the scattering of light and makes it possible to effectively maintain optical properties (reflection and transmission of light) of the base material.

EXAMPLES

Excellent properties of the coating formed by using the coating composition of the invention will now be described by way of Experimental Examples.

<Evaluating the Attained Humidity>

The coating was dried at 140° C. for one hour. 0.5 Grams of the material to be measured and a wireless thermometer/hygrometer (Hygroclone, manufactured by KN Laboratories, Inc.) were put into a cup of a water-impermeable steel-foiled laminate having a volume of 85 cm$^3$. The mouth of the container was heat-sealed with a lid of an aluminum foil-laminated film. After left to stand at 30° C. 80% RH for one day, the relative humidity in the container was regarded as the attained humidity.

<Measuring the Saturated Hygroscopic Amount>

The saturated hygroscopic amount in the hygroscopic layer was found according to the following procedure.

The weight (X) of the glass base plate was measured.

A hygroscopic film was formed on the glass base plate, dried at 140° C. for one hour, and was measured for its weight (Y).

Next, the sample was left to stand in an air-conditioned vessel in which the atmosphere was adjusted to be 30° C. 80% RH for 24 hours, and was measured for its weight (Z) after it has absorbed moisture.

From the above measured results, the saturated hygroscopic amount of the hygroscopic film was calculated according to the following formula, (Z—Y)/(Y—X)

and was evaluated on the following basis.

⊚: The saturated hygroscopic amount was 0.7 g/g or more.

○: The saturated hygroscopic amount was 0.6 or more but was not more than 0.7 g/g.

×: The saturated hygroscopic amount was not more than 0.6 g/g.

<Measuring the Contact Angle of Water>

A 3-μL of water droplet was caused to drop on the surface of the hygroscopic film formed on the glass base plate. After one minute has passed, the water droplet was measured for its angle of contact and was evaluated on the following basis.

○: The contact angle of water is 40 degrees or less.

×: The contact angle of water is more than 40 degrees.

<Measuring the Hazes>

By using an SM color computer (SM-4, manufactured by Suga Test Instruments Co., Ltd.), the hygroscopic film was measured for its haze in compliance with the JIS-K7361-1, and was evaluated on the following basis.

○: The haze is 5% or less.

×: The haze is more than 5%.

<Measuring the Maximum Surface Roughness Ra (JIS B-0601-1994)>

A maximum surface roughness Ra of the surface of the hygroscopic film formed on the glass base plate was measured by using an interatomic force microscope (NanoScope III, manufactured by Digital Instruments Co.), and was evaluated on the following basis.

○: Maximum surface roughness Ra is 0.1 μm or less.

×: Maximum surface roughness Ra is more than 0.1 μm.

<Evaluating the Defogging Capability>

The surface of the hygroscopic film formed on the glass base plate was exposed over a warm water bath heated at 40° C., measured for its defogging time (in minutes) until it was fogged or distorted due to water film, and was evaluated on the following basis.

○: Was not fogged for one minute or more.

×: Fogged in less than one minute.

Example 1

The following compounds were provided as the cationic polymer and the hygroscopic agent.

Cationic Polymer;
  PAA-15C (aqueous solution) containing 15% by mass of a solid component, manufactured by Nittobo Medical Co., Ltd.

Hygroscopic Agent;
  Crosslinked product of Na polyacrylate.
  TAFTIC HU-820E (aqueous dispersion) containing 13% by mass of a solid component, manufactured by Toyobo Co., Ltd.

A polymer solution was obtained by diluting the above cationic polymer (polyallylamine) with water such that the solid component thereof was 5% by weight.

On the other hand, a solution of the crosslinking agent was prepared by dissolving a γ-glycidoxypropyltrimethoxysilane, as the crosslinking agent, in water such that the amount thereof was 5% by weight.

Next, the polymer solution and the solution of the crosslinking agent were mixed together such that the amount of the γ-glycidoxypropyltrimethoxysilane was 15 parts by weight per 100 parts by weight of the polyallylamine. To the mixed solution was, further, added the above hygroscopic agent (crosslinked product of Na polyacrylate) in an amount of 410 parts by weight with respect to the cationic polymer, and to which was, further, added water such that the amount of the solid component was 5%. The mixture was stirred well to obtain a coating solution.

By using a bar coater, the above coating solution was applied onto a clean glass that has been polished and washed.

The film after applied was heat-treated in a box-type electric oven under the conditions of a peak temperature of 120° C. and a peak temperature-holding time of 10 seconds. There was formed a coating of a thickness of 4 μm.

Example 2

By using an ion-exchange resin (Amberlite 200CT produced by Organo Corporation), the Na salt-type carboxyl groups of the crosslinked product (HU-820E) of the Na polyacrylate were converted into the H-type carboxyl groups. Thereafter, by using a 1 N aqueous solution of the potassium hydroxide, there was obtained a crosslinked product (aqueous dispersion) of the K polyacrylate having K salt-type carboxyl groups.

Properties of the crosslinked product were as described below.

Crosslinked Product (Aqueous Dispersion) of the K Polyacrylate;
  Solid component: 10% by mass
  Mean particle diameter $D_{50}$: 70 nm
  Neutralization ratio: 80%

A coating was formed in the same manner as in Example 1 but using the crosslinked product of the above K polyacrylate as the hydroscopic agent.

Example 3

A crosslinked product (aqueous dispersion) of the K polyacrylate was obtained in the same manner as in Example 2 but using a 1 N aqueous solution of the lithium hydroxide instead of using the 1 N aqueous solution of the potassium hydroxide. By using the crosslinked product, a coating was formed in the same manner as in Example 2.

Example 4

A crosslinked product (aqueous dispersion) of the cesium polyacrylate was obtained in the same manner as in Example 2 but using a 1 N aqueous solution of the cesium hydroxide instead of using the 1 N aqueous solution of the potassium hydroxide. By using the crosslinked product, a coating was formed in the same manner as in Example 2.

Example 5

A coating was formed in the same manner as in Example 1 but adding the hydroscopic agent in an amount of 100 parts by weight relative to the polyallylamine.

Example 6

A coating was formed in the same manner as in Example 1 but adding the hydroscopic agent in an amount of 700 parts by weight relative to the polyallylamine.

Example 7

A coating was formed in the same manner as in Example 1 but so mixing the polymer solution and the crosslinking agent solution that the amount of the γ-glycidoxypropyltrimethoxysilane which is the crosslinking agent was 7 parts by weight relative to the polyallylamine and, further, adding the hygroscopic agent in an amount of 380 parts by weight relative to the polyallylamine.

Example 8

A coating was formed in the same manner as in Example 1 but so mixing the polymer solution and the crosslinking agent solution that the amount of the γ-glycidoxypropyltrimethoxysilane which is the crosslinking agent was 50 parts by weight relative to the polyallylamine and, further, adding the hygroscopic agent in an amount of 530 parts by weight relative to the polyallylamine.

Example 9

A coating was formed in the same manner as in Example 1 but using a β-(3,4-epoxycyclohexyl)ethyltrimethoxysilane as the crosslinking agent.

Example 10

A coating was formed in the same manner as in Example 1 but so mixing the polymer solution and the crosslinking agent solution that the amount of the γ-glycidoxypropyltrimethoxysilane which is the crosslinking agent was 16 parts by weight relative to the polyallylamine and, further, adding, as the crosslinking agent, a diglycidyl 1,2-cyclohexanedicarboxylate in an amount of 4 parts by weight relative to the polyallylamine.

Example 11

A coating was formed in the same manner as in Example 1 but using, as the solvent in the coating solution, a mixed solvent of water and acetone (at a weight ratio of 80/20) instead of using water only, adding, as the crosslinking agent, the diglycidyl 1,2-cyclohexanedicarboxylate in an amount of 20 parts by weight per 100 parts by weight of the polyallylamine, and, further, adding the hygroscopic agent in an amount of 170 parts by weight relative to the polyallylamine.

Example 12

A coating was formed in the same manner as in Example 1 but using a polyethyleneimine (Polyethyleneimine 10000 manufactured by Junsei Chemical Co., Ltd.) as the ionic polymer.

Example 13

A coating was formed in the same manner as in Example 1 but using, as the ionic polymer, a polyacrylic acid (AC-10LP manufactured by Nihon Junyaku Co.) that was partly neutralized by 80% with the sodium hydroxide, using, as the solvent, a mixed solvent of water and acetone (at a weight ratio of 80/20), using, as the crosslinking agent, a diglycidyl 1,2-cyclohexanedicarboxylate in an amount of 15 parts by weight relative to the partly neutralized product of the polyacrylic acid, using, as the adhesive agent, a β-(3,4-epoxycyclohexyl)ethyltrimethoxysilane in an amount of 3 parts by weight relative to the partly neutralized product of the polyacrylic acid, and adding the hygroscopic agent in an amount of 410 parts by weight relative to the partly neutralized product of the polyacrylic acid.

Example 14

A coating was formed in the same manner as in Example 13 but using the hygroscopic agent in an amount of 100 parts by weight relative to the partly neutralized product of the polyacrylic acid.

Example 15

A coating was formed in the same manner as in Example 13 but using the hygroscopic agent in an amount of 700 parts by weight relative to the partly neutralized product of the polyacrylic acid.

Example 16

A coating was formed in the same manner as in Example 13 but adding the diglycidyl 1,2-cyclohexanedicarboxylate that is the crosslinking agent in an amount of 1 part by weight relative to the partly neutralized product of the polyacrylic acid and adding the hygroscopic agent in an amount of 365 parts by weight relative to the partly neutralized product of the polyacrylic acid.

Example 17

A coating was formed in the same manner as in Example 13 but adding the diglycidyl 1,2-cyclohexanedicarboxylate that is the crosslinking agent in an amount of 50 parts by weight relative to the partly neutralized product of the polyacrylic acid and adding the hygroscopic agent in an amount of 540 parts by weight relative to the partly neutralized product of the polyacrylic acid.

Example 18

A coating was formed in the same manner as in Example 13 but adding the β-(3,4-epoxycyclohexyl)ethyltrimethoxysilane that is the adhesive agent in an amount of 0.3 parts by weight relative to the partly neutralized product of the polyacrylic acid and adding the hygroscopic agent in an amount of 420 parts by weight relative to the partly neutralized product of the polyacrylic acid.

Example 19

A coating was formed in the same manner as in Example 13 but adding the β-(3,4-epoxycyclohexyl)ethyltrimethoxysilane that is the adhesive agent in an amount of 10 parts by weight relative to the partly neutralized product of the polyacrylic acid and adding the hygroscopic agent in an amount of 460 parts by weight relative to the partly neutralized product of the polyacrylic acid.

Example 20

A coating was formed in the same manner as in Example 13 but partly neutralizing the polyacrylic acid to a ratio of 50%, using an ethylene glycol diglycidyl ether as the crosslinking agent, and conducting the heat treatment at a temperature of 160° C.

Comparative Example 1

A coating was formed in the same manner as in Example 1 but adding the hygroscopic agent in an amount of 30 parts by weight relative to the polyallylamine.

Comparative Example 2

A coating was formed in the same manner as in Example 13 but adding the hygroscopic agent in an amount of 30 parts by weight relative to the partly neutralized product of the polyacrylic acid.

Comparative Example 3

A coating was formed in the same manner as in Example 1 but using a polyvinyl alcohol (PVA103 manufactured by Kuraray Co., Ltd.) instead of using the ionic polymer.

<Tests for Evaluation>

The coatings formed in the above Examples and Comparative Examples were measured for their properties by the methods described above. Tables 1 to 3 show the compositions of the coatings while Tables 4 to 6 show the measured results.

The coatings of Comparative Examples 1 to 3 possessed so low transparencies that their defogging properties were not evaluated.

The following Tables use the following abbreviations.

γ-GLY-silane:
  γ-glycidoxypropyltrimethylsilane
β-EPO-silane:
  β-(3,4-epoxycyclohexyl)ethyltrimethoxysilane
1,2-DCA-diglycidyl:
  diglycidyl 1,2-cyclohexanedicarboxylate
ETGDGL-ether:
  ethylene glycol diglycidyl ether

TABLE 1

| | *1 | *2 | *3 | *4 | *5 | *6 | *7 |
|---|---|---|---|---|---|---|---|
| Ex. 1 | polyallylamine (100) | — | 7.1 | HU-820E (410) | 0.0 | γ-GLY-silane (15) | — |
| Ex. 2 | polyallylamine (100) | — | 7.1 | K salt type (410) | 0.0 | γ-GLY-silane (15) | — |
| Ex. 3 | polyallylamine (100) | — | 7.1 | Li salt type (410) | 0.0 | γ-GLY-silane (15) | — |
| Ex. 4 | polyallylamine (100) | — | 7.1 | Cs salt type (410) | 0.0 | γ-GLY-silane (15) | — |
| Ex. 5 | polyallylamine (100) | — | 7.1 | HU-820E (80) | 0.0 | γ-GLY-silane (15) | — |
| Ex. 6 | polyallylamine (100) | — | 7.1 | HU-820E (700) | 0.0 | γ-GLY-silane (15) | — |
| Ex. 7 | polyallylamine (100) | — | 7.1 | HU-820E (380) | 0.0 | γ-GLY-silane (7) | — |
| Ex. 8 | polyallylamine (100) | — | 7.1 | HU-820E (530) | 0.0 | γ-GLY-silane (50) | — |
| Ex. 9 | polyallylamine (100) | — | 7.1 | HU-820E (430) | 0.0 | β-EPO-silane (20) | — |
| Ex. 10 | polyallylamine (100) | — | 7.1 | HU-820E (430) | 0.0 | γ-GLY-silane (16) 1,2-CYDC-diglycidyl(4) | — |

*1: Ionic polymer (amount),
*2: Neutralization ratio (%),
*3: Humidity attained by ionic polymer (% RH),
*4: Hygroscopic agent (amount),
*5: Humidity attained by hygroscopic agent (% RH),
*6: Crosslinking agent (amount),
*7: Adhesive agent (amount)

TABLE 2

| | *1 | *2 | *3 | *4 | *5 | *6 | *7 |
|---|---|---|---|---|---|---|---|
| Ex. 11 | polyallylamine (100) | — | 7.1 | HU-820E (170) | 0.0 | 1,2-CYDC-diglycidyl (20) | — |
| Ex. 12 | polyethyleneimine (100) | — | 7.3 | HU-820E (410) | 0.0 | γ-GLY-silane (15) | — |
| Ex. 13 | polyacrylicacid (100) | 80 | 7.9 | HU-820E (410) | 0.0 | 1,2-CYDC-diglycidyl (15) | β-EPO-silane (3) |
| Ex. 14 | polyacrylicacid (100) | 80 | 7.9 | HU-820E (80) | 0.0 | 1,2-CYDC-diglycidyl (15) | β-EPO-silane (3) |
| Ex. 15 | polyacrylicacid (100) | 80 | 7.9 | HU-820E (700) | 0.0 | 1,2-CYDC-diglycidyl (15) | β-EPO-silane (3) |
| Ex. 16 | polyacrylicacid (100) | 80 | 7.9 | HU-820E (365) | 0.0 | 1,2-CYDC-diglycidyl (1) | β-EPO-silane (3) |
| Ex. 17 | polyacrylicacid (100) | 80 | 7.9 | HU-820E (540) | 0.0 | 1,2-CYDC-diglycidyl (50) | β-EPO-silane (3) |
| Ex. 18 | polyacrylicacid (100) | 80 | 7.9 | HU-820E (420) | 0.0 | 1,2-CYDC-diglycidyl (20) | β-EPO-silane (0.3) |
| Ex. 19 | polyacrylicacid (100) | 80 | 7.9 | HU-820E (460) | 0.0 | 1,2-CYDC-diglycidyl (20) | β-EPO-silane (10) |
| Ex. 20 | polyacrylicacid (100) | 50 | 18.0 | HU-820E (430) | 0.0 | ETGDGL-ether (20) | β-EPO-silane (3) |

*1: Ionic polymer (amount),
*2: Neutralization ratio (%),
*3: Humidity attained by ionic polymer (% RH),
*4: Hygroscopic agent (amount),
*5: Humidity attained by hygroscopic agent (% RH),
*6: Crosslinking agent (amount),
*7: Adhesive agent (amount)

TABLE 3

| | *1 | *2 | *3 | *4 | *5 | *6 | *7 |
|---|---|---|---|---|---|---|---|
| Comp. Ex. 1 | polyallylamine (100) | — | 7.1 | HU-820E (30) | 0.0 | γ-GLY-silane (15) | — |
| Comp. Ex. 2 | polyacrylicacid (100) | 80 | 7.9 | HU-820E (30) | 0.0 | 1,2-CYDC-diglycidyl (15) | β-EPO-silane (3) |
| Comp. Ex. 3 | polyvinylalcohol (100) | — | 68.0 | HU-820E (410) | 0.0 | γ-GLY-silane (15) | — |

*1: Ionic polymer (amount),
*2: Neutralization ratio (%),
*3: Humidity attained by ionic polymer (% RH),
*4: Hygroscopic agent (amount),
*5: Humidity attained by hygroscopic agent (% RH),
*6: Crosslinking agent (amount),
*7: Adhesive agent (amount)

TABLE 4

| | Saturated hygroscopic amount (g/g) | Water contact angle (deg.) | Haze (%) | Surface roughness (μm) | Defogging property |
|---|---|---|---|---|---|
| Ex. 1 | ◎ (0.78) | ○ (33) | ○ (2.5) | ○ (0.04) | ○ |
| Ex. 2 | ◎ (0.73) | ○ (19) | ○ (2.7) | ○ (0.04) | ○ |
| Ex. 3 | ◎ (0.81) | ○ (30) | ○ (2.3) | ○ (0.05) | ○ |
| Ex. 4 | ◎ (0.60) | ○ (35) | ○ (2.3) | ○ (0.04) | ○ |
| Ex. 5 | ◎ (0.74) | ○ (39) | ○ (4.1) | ○ (0.1) | ○ |
| Ex. 6 | ◎ (0.73) | ○ (31) | ○ (2.2) | ○ (0.04) | ○ |
| Ex. 7 | ◎ (0.71) | ○ (35) | ○ (2.4) | ○ (0.04) | ○ |
| Ex. 8 | ◎ (0.74) | ○ (37) | ○ (2.7) | ○ (0.04) | ○ |
| Ex. 9 | ◎ (0.75) | ○ (33) | ○ (2.7) | ○ (0.04) | ○ |
| Ex. 10 | ◎ (0.73) | ○ (34) | ○ (2.1) | ○ (0.04) | ○ |

TABLE 5

| | Saturated hygroscopic amount (g/g) | Water contact angle (deg.) | Haze (%) | Surface roughness (μm) | Defogging property |
|---|---|---|---|---|---|
| Ex. 11 | ◎ (0.78) | ○ (38) | ○ (2.5) | ○ (0.07) | ○ |
| Ex. 12 | ◎ (0.71) | ○ (36) | ○ (2.4) | ○ (0.04) | ○ |
| Ex. 13 | ◎ (0.79) | ○ (33) | ○ (2.2) | ○ (0.05) | ○ |
| Ex. 14 | ◎ (0.78) | ○ (36) | ○ (4.8) | ○ (0.09) | ○ |
| Ex. 15 | ◎ (0.79) | ○ (37) | ○ (2.1) | ○ (0.04) | ○ |
| Ex. 16 | ◎ (0.76) | ○ (39) | ○ (2.5) | ○ (0.05) | ○ |
| Ex. 17 | ◎ (0.74) | ○ (36) | ○ (2.0) | ○ (0.06) | ○ |
| Ex. 18 | ◎ (0.73) | ○ (40) | ○ (2.5) | ○ (0.06) | ○ |
| Ex. 19 | ◎ (0.78) | ○ (39) | ○ (2.0) | ○ (0.05) | ○ |
| Ex. 20 | ○ (0.60) | ○ (33) | ○ (2.0) | ○ (0.1) | ○ |

TABLE 6

| | Saturated hygroscopic amount (g/g) | Water contact angle (deg.) | Haze (%) | Surface roughness (μm) | Defogging property |
|---|---|---|---|---|---|
| Comp. Ex. 1 | ○ (0.63) | ○ (39) | X (29.8) | X (0.28) | — |
| Comp. Ex. 2 | ○ (0.66) | ○ (40) | X (85.1) | X (0.45) | — |
| Comp. Ex. 3 | ○ (0.61) | ○ (39) | X (43.1) | X (0.36) | — |

What is claimed is:

1. A coating formed on a surface of a base material, the coating comprising a matrix of a cationic polymer (a) and a hygroscopic agent (b) dispersed in the matrix, the hygroscopic agent (b) being a granular crosslinked product of a monovalent metal salt of a poly(meth)acrylic acid and being contained in an amount of 75 to 700 parts by mass per 100 parts by mass of the ionic polymer (a), and the coating having a haze of 5% or less and a maximum surface roughness Ra (JIS B-0601-1994) of 0.1 μm or less,
    wherein the cationic polymer constituting the matrix is polyallylamine, and
    wherein a crosslinked structure derived from a silane compound represented by formula (1) is introduced into the polyallylamine matrix:

$$X\text{—}SiR^1{}_n(OR^2)_{3-n} \qquad (1)$$

wherein, X is an organic group having an epoxy group at a terminal thereof,
    $R^1$ and $R^2$ are, respectively, methyl groups, ethyl groups or isopropyl groups, and
    n is 0, 1 or 2.

2. The coating according to claim 1, wherein the coating is used as a water shut-off film.

3. The coating according to claim 1, wherein the coating is used as a defogging film.

* * * * *